United States Patent [19]
Kostelnicek et al.

[11] 3,936,758
[45] Feb. 3, 1976

[54] PHASE DIFFERENCE DETECTOR

[75] Inventors: Richard J. Kostelnicek; Curtis B. Herbert, Jr., both of Houston, Tex.; Thomas H. Crawford, Dhahran, Saudi Arabia

[73] Assignee: Exxon Production Research Company, Houston, Tex.

[22] Filed: Mar. 20, 1975

[21] Appl. No.: 560,067

Related U.S. Application Data

[62] Division of Ser. No. 421,384, Dec. 3, 1973, Pat. No. 3,889,229.

[52] U.S. Cl. ............................ 328/133; 307/233 R
[51] Int. Cl.² ........................................ H03B 3/04
[58] Field of Search ............. 328/133, 134; 307/233

[56] References Cited
UNITED STATES PATENTS

| | | | |
|---|---|---|---|
| 3,327,226 | 6/1967 | Nourney | 307/233 X |
| 3,515,997 | 6/1970 | Babany | 328/134 |
| 3,588,710 | 6/1971 | Masters | 328/133 |
| 3,805,153 | 4/1974 | Gallant | 318/133 X |

*Primary Examiner*—John S. Heyman
*Attorney, Agent, or Firm*—E. Eugene Thigpen

[57] ABSTRACT

Apparatus is described for eliminating monochromatic interfering frequency components of seismic signals detected during the course of seismic exploration comprising an electrical circuit for producing a monochromatic nulling signal that has the same frequency as the interfering signal. The monochromatic nulling signal is produced by generating a truncated triangular wave having the same period as the interfering signal and filtering the truncated triangular wave to remove all components thereof except those having the period of the interfering signal. Circuit means are provided for controlling the amount of truncation of the truncated triangular wave, and for controlling the time phase thereof. The filtered signal is combined with the geophone signal in such a manner that the filtered signal at least partially cancels out the interfering component of the seismic signal. Circuit means are provided for detecting the phase of the residual signal resulting from incomplete cancellation of the interfering signal to provide an indication of the amplitude of the nulling signal. Means are also provided for detecting the time phase of the nulling signal. The truncation of the truncated triangular wave, and the time phase of the truncated triangular wave are controlled so as to result in more complete cancellation.

1 Claim, 6 Drawing Figures

| $C_{OUT}$ | $S_2$ | $S_1$ |
|---|---|---|
| 1 | 0 | 0 |
| 0 | 0 | 1 |
| 0 | 1 | 0 |
| 0 | 1 | 1 |
| 1 | 0 | 0 |
| 0 | 0 | 1 |
| 0 | 1 | 0 |
| 0 | 1 | 1 |

| $C_{OUT}$ | $S_2$ | $S_1$ |
|---|---|---|
| 1 | 0 | 0 |
| 0 | 1 | 0 |
| 1 | 0 | 0 |
| 0 | 1 | 0 |
| 1 | 0 | 0 |
| 0 | 1 | 0 |
| 1 | 0 | 0 |
| 0 | 1 | 0 |

| $C_{OUT}$ | $S_2$ | $S_1$ |
|---|---|---|
| 1 | 0 | 0 |
| 0 | 1 | 1 |
| 1 | 1 | 0 |
| 1 | 0 | 1 |
| 1 | 0 | 0 |
| 0 | 1 | 1 |
| 1 | 1 | 0 |
| 1 | 0 | 1 |

… … …

PHASE DIFFERENCE DETECTOR

CROSS-REFERENCE TO RELATED APPLICATIONS

This application is a Divisional of copending application Ser. No. 421,384 filed Dec. 3, 1973 now U.S. Pat. No. 3,889,229.

BACKGROUND OF THE INVENTION

This invention relates generally to seismic exploration and more particularly to a system for removing a substantially sinusoidal interfering signal from a seismic signal made up of the interfering signal and of signals produced as a result of seismic energy detected during the course of seismic exploration.

The problem of eliminating from recordings of geophone signals certain monochromatic interfering signals that are picked up by the long leads that are customarily used for connecting geophones to recorders is not a new one. Various attempts have been made to eliminate such interfering signals, which are usually produced by 60-cycle or 120-cycle electromagnetic energy originating from power lines. For example, notch filters have been used for many years for this purpose. A difficulty with the use of notch filters is that they produce considerable phase distortion for signals having frequencies in the vicinity of the frequency to be eliminated by the filter. Also, attempts have been made to produce nulling signals of opposite time-phase relationship from the detected monochromatic signals to be eliminated as evidenced by the following U.S. Pat. Nos. 2,438,217-Johnson; 2,733,412-Alexander; 3,757,235-Tvedt et al. Apparatus making use of such a technique has generally not been satisfactory in the past because the frequency and phase of the interfering signal is not stable and any variations thereof will produce a residual signal on the seismic records. The nulling signal has to match the interfering signal in amplitude, frequency and phase if it is to satisfactorily cancel the interfering signal. Systems used in the past have been deficient in this respect, particularly in view of the fact that the frequency, the phase, and the amplitude of the interfering signal are subject to change from time to time.

SUMMARY OF THE INVENTION

In accordance with the teachings of the present invention, apparatus for eliminating a substantially monochromatic interfering signal from a seismic signal that is a composite of a geophone output signal and the interfering signal includes means for producing a monochromatic electrical nulling signal having the same frequency as the interfering signal. In addition there is provided means for combining the seismic signal and the nulling signal so that the nulling signal cancels out at least a portion of the interfering signal component of the seismic signal. Apparatus is provided for detecting the time phase of the nulling signal relative to that of the interfering signal and for producing a first control indicative of the phase difference. The latter named means also produces a second control signal responsive to the amplitude of the residual signal. Additional means is provided for varying the time phase of the nulling signal responsive to the first control signal and for varying the amplitude of the nulling signal responsive to the second signal to minimize the amplitude of the residual signal.

Objects and features of the present invention not apparent from the foregoing discussion will become evident upon consideration of the following detailed description of one embodiment of the invention when considered in conjunction with the accompanying drawings, which should be taken by way of example and not necessarily by way of limitation.

DETAILED DESCRIPTION OF A PREFERRED EMBODIMENT OF THE INVENTION

Figure 1:
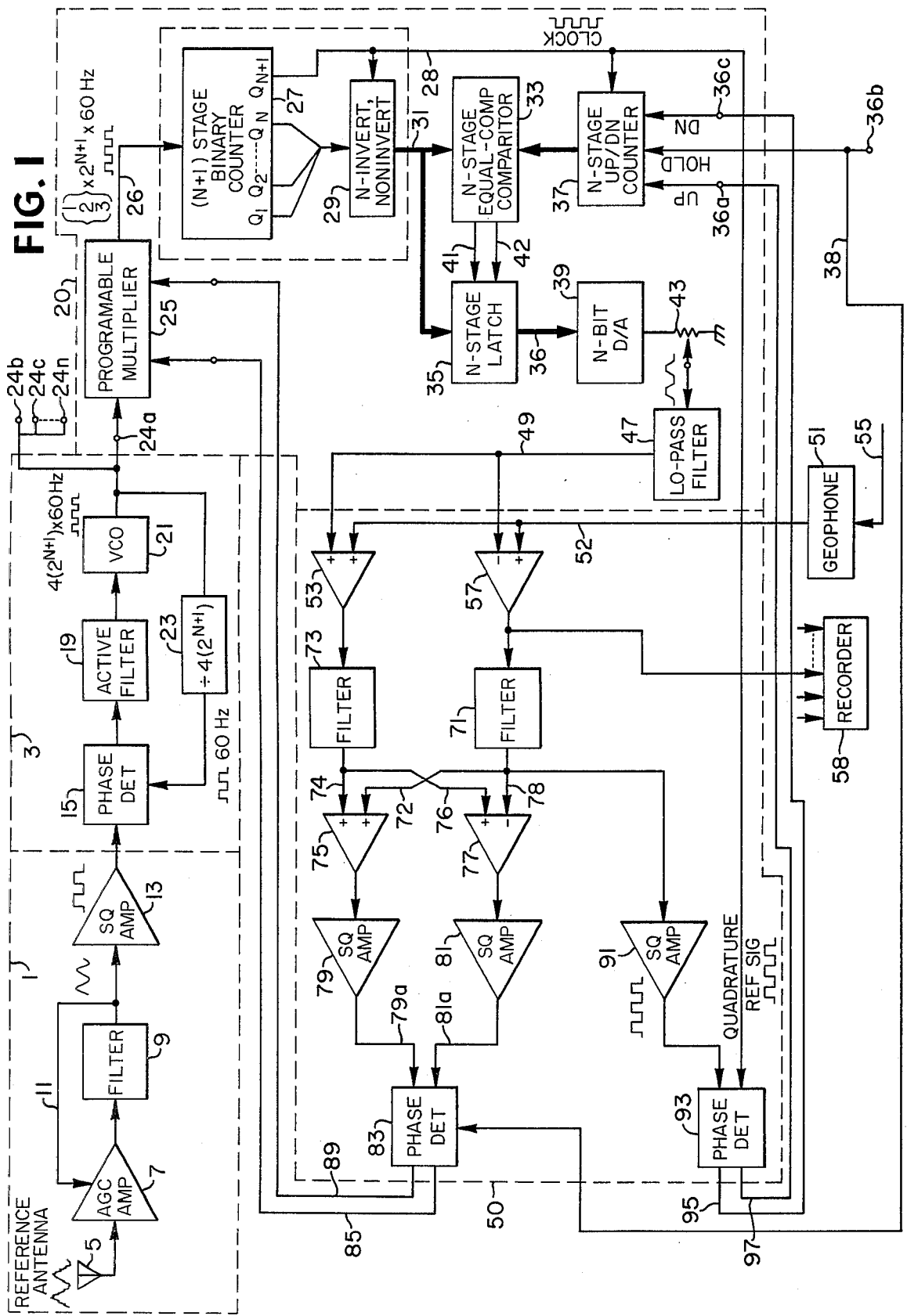
FIG. 1 is a schematic diagram of a preferred embodiment of the invention.

The embodiment of the invention illustrated in FIG. 1 of the drawings makes use of tandem-connected electrical circuits 1 and 3 that function to produce a rectangular wave output signal having a frequency or repetition rate that is a multiple of the interfering electromagnetic signal. Electrical circuit 1, which functions to produce a rectangular wave signal of the same frequency as the interfering signal, comprises an antenna 5 for detecting the interfering signal, an automatic gain control amplifier 7, a filter 9 connected to the output of amplifier 7 for eliminating transients and multiples of the interfering signal, an AGC control line 11 from the output of filter 9 back to the automatic gain control amplifier, and a squaring or amplitude limiting circuit 13 for producing a rectangular wave output signal of the same period as the signal from filter 9 connected to the input thereof. The antenna 5 may be a loop antenna or may be simply a spare geophone line not being otherwise used. The function of electrical circuit 3 is to generate a signal having a pulse rate which is a multiple of the repetition rate of the output signal from squaring amplifier 13, and preferably the multiple being $2^{n+3}$ where $n$ is determined as described below. The output signals from squaring amplifier 13 are applied to a phase-locked loop comprising a phase detector 15, an active filter 19, and a voltage controlled oscillator (VCO) 21 all connected in tandem, and a dividing circuit 23 for connecting the output pulses from voltage controlled oscillator 21 to an input circuit of the phase detector 15. The phase detector 15 may be a D-type flip-flop circuit. Phase-locked loops such as illustrated in FIG. 1 are conventional in the art and will not be described further herein. The output signals from the voltage controlled oscillator 21 are applied to input terminals 24a, 24b, 24c, ... 24n of a multiplicity of nulling signal generating and interfering signal cancelling circuits, one of which is designated by the blocks carrying the reference numerals 20 and 50. There is provided one such nulling signal generating circuit and interfering signal cancelling circuit for each of the seismic channels in the seismic system under consideration. Conventionally 24 or 48 such circuits will be provided; however, only one circuit is required for detecting the interfering electromagnetic signal and for producing a rectangular wave signal having a pulse repetition rate that is a multiple of the frequency of the detected interfering signal.

The pulse signal appearing at terminal 24a is applied to a programmable multiplier 25 the function of which is to produce an output pulse train having a controllable average frequency which is controlled so as to be equal to, less than, or greater than one half of the frequency or pulse repetition rate of the signals appearing at terminal 24a. By momentarily increasing or decreasing the frequency of the pulses appearing on output line 26, the time-phase of the nulling signal is advanced or retarded. The output pulse train from multiplier 25 is applied to a circuit including circuit elements 27, 29, 35, 33, 37, 39, and 47, the function of which is to produce a sinusoidal signal having the same frequency as the interfering signal, the time phase of which may be increased or decreased by first logic signals generated thereby, and the amplitude of which may be adjusted by second logic signals generated thereby. More specifically, the circuit elements 27, 29, 33, 37, 35, and 39 produce a truncated triangular wave signal having a fundamental frequency component that is the same as the frequency of the interfering signal. Circuits 27 and 29 together produce an output count that, if applied to a digital to analog converter, would produce a triangular output wave having a fundamental frequency component that is the same as the frequency of the interfering signal. The output pulses from the multiplier 25 are applied to circuit element 27 which may be an "$n+1$" stage binary counter of conventional design having output circuits $Q_1, Q_7, \ldots Q_n, Q_{n+1}$. (The quantity "n" simply determines the precision of the system, and is arbitrary.) This circuit produces an output count which, if applied to a digital to analog converter, would produce a saw-tooth signal the period of which would be half the period of the interfering signal. The output count from the circuit 27 is applied to an N-INVERT, NONINVERT circuit 29, the function of which is to invert the count appearing on the output leads $Q_1, Q_2, \ldots Q_n$ of binary counter 27 on every other counting cycle thereof so that the output count from circuit 29, if applied to an analog-to-digital converter would appear as a triangular wave signal. The N-INVERT, NONINVERT circuit 29 may be comprised of "N" EXCLUSIVE OR-gates.

Also as part of circuit 20, there is provided an N-STAGE UP/DOWN COUNTER 37 the function of which is to generate a static digital number that can be incremented, decremented, or held steady in accordance with signals applied to input terminals thereof designated by the reference numerals 36a, 36c, and 36b. The output signals from the N-INVERT, NONINVERT circuit 29 and from the N-STAGE, UP/DOWN COUNTER 37 are both applied to an N-STAGE EQUAL-COMPLEMENTARY COMPARATOR circuit 33 the function of which is to produce a pulse when the signals from the circuits 29 and 37 are indicative of the same number $Y = X$ or when $$Y = (2^n-1) - X$$

where Y is the output of circuit 29 and X is the output of circuit 37. When the two circuits produce signals that are indicative of the same number, a pulse appears on line 41, and when they produce a signal indicative of $Y = (2^n-1) = X$, a signal appears on line 42. Concomitantly, the output signals from the N-INVERT, NONINVERT circuit 29 are applied to an N-STAGE LATCH circuit 35, which may be a conventional LATCH cicuit as manufactured by RCA and designated by Model No. CD4042, the function of which is to pass or discontinue changes in the output count or in other words truncate the output count of the N-INVERT, NONINVERT circuit 29 in accordance with the command signals on lines 41 and 42. The output signals from the N-STAGE LATCH are applied through a plurality of leads generally designated by the reference numeral 36 to an "$n$-bit" digital-to-analog converter 39. The truncated triangular output signal from the n-bit digital-to-analog converter 39 is applied through a potentiometer 45 to a low-pass filter 47, the function of which is to eliminate from the truncated triangular wave all harmonic signal components thereof having frequencies greater than the frequency of the interfering signal. For example, if the frequency of the interfering signal is 60 Hz, the lowpass filter preferably would pass only signals have frequencies less than about 63 Hz. The potentiometer 43 acts as a range adjustment. The sinusoidal output signal from the low-pass filter 47 is applied to electrical circuit 50, the function of which is to produce electrical control signals for adjusting the time-phase of the output signal from filter 47, and to produce control signals for adjusting the amplitude of the output signals from low-pass filter 47 in order to most effectively null undesired components of the signal on line 52 as applied to amplifiers 53 and 57 as will be described in detail hereinafter.

Difference taking or nulling amplifier 57 receives input signals from the seismic channel including geophone 51 and from low-pass filter 47 through lines 52 and 49 respectively. (Line 52 is the field transmission line from geophone 51 to amplifier 57) The same signals are applied to a summing amplifier 53 so that in effect the output of amplifier 57 is equal to the difference between the two signals while the output from amplifier 53 is equal to the sum of the two signals. In the ensuing discussion the signal from geophone 51 will be termed the "S" signal while the signal from filter 47 will be termed the "I" signal. The output signal from amplifier 57 is applied to seismic recorder 58 along with similar signals from other similar units connected to other seismic channels. The signals from amplifiers 53 and 57 also are applied to band-pass filters 73 and 71 which are designed to be as nearly alike as possible so that their transfer functions (herein designated as $\theta$ and $\phi$) will be as similar as possible. The output signal from filter 73 therefore can be represented by the formula:

$$\theta (S+I)$$

and the output signal from filter 71 can be represented by the formula:

$$\phi (S-I)$$

Both signals are applied to the input circuits of summing amplifier 75 and difference taking amplifier 77. The output signals from amplifier 75 can be represented by $S(\theta + \phi) + I(\theta - \phi)$ and the output signals from amplifier 77 can be represented by $I(\theta + \phi) + S(\theta - \phi)$. These signals are applied respectively to squaring amplifiers 79 and 81 the function of which is to produce rectangular wave output signals having the same frequency and phase as the output signals from amplifier 75 and 77 respectively. These signals are applied on line 79a and 81a to a phase detector 83, the function of which is to produce output logic signals on lines 85 and 89 representative of whether the signal on line 79a is lagging or leading the signal on line 81a. The phase detector 83 also receives signals on line 38 to override and render ineffective the signals on line 79a and 81a, as will be described in more detail below with respect to FIG. 4.

If the interfering signal from signal transmission line 55 were a substantially monochromatic sinusoidal wave as is the output signal of filter 47 then the lead 52 could be connected to the input of squaring amplifier 81 and lead 49 could be connected to the input of squaring amplifier 79. Phase detector 83 would then detect the phase difference between the two signals, and logic signals related thereto would be produced on lines 85 and 89. However, there is no guarantee that the interfering signal from transmission line 52 is a purely sinusoidal signal. For example, the interfering signal may have some other frequency components associated therewith such as harmonics of the fundamental power line frequency and seismic signals such as are produced by the wind, traffic, and general ground unrest. Therefore, it is necessary to extract only the interfering signal component from the signal on line 52 and null that component only. It is necessary to apply the signal on line 52 to a filter 71 to extract only the 60 cycle component or interfering signal. The signal could then be applied directly to squaring amplifier 81. However, filters have a phase shift associated therewith. Therefore, it is necessary to apply a compensating filter 73 of the same design as filter 71 at the input of squaring amplifier 79 so that the phase shifts produced by filters 71 and 73 are as nearly the same as possible. Unfortunately, two filters cannot be made to have identical characteristics or be made to remain identical, so the filtered signal from line 52 and the filtered signal from line 49 which would appear at the output of filter 71 and 73 could produce phase differences because of the different characteristics of the filters. In order to alleviate this problem, the multiplexing circuit described above is used wherein the sum and difference signals are produced at the outputs of amplifiers 57 and 53 respectively, so that half of the signal from the output of amplifiers 74 and 78 is due to the signal on line 52 while the remaining half of the signal is due to the signal on line 49. In other words, the signal 52 passes through filter 73 and 71 and the signal on line 49 passes through filter 71 and 73. The signals are then separated or demultiplexed by summing and differencing amplifiers 77 and 75 so that the output of amplifier 77 is the same as the signal from line 52 but modified by both filters 71 and 73. Also, the output of amplifier 75 is the same as the signal from line 49 but modified by filter 71 and 73. Manifestly, the output signals from amplifiers 77 and 75 are processed in turn by a combination of filters 71 and 75 in accordance with equations as stated above.

In addition to producing control signals for correcting the phase of the system described above, there are also produced control signals for correcting the amplitude of the nulling signal in order to make it most effective in its function. To this end, the output of band-pass filter 71 also is applied to a squaring amplifier 91 for converting the sinusoidal signal from filter 71 to a rectangular wave signal of the same period. The rectangular wave output signal from squaring amplifier 91 is applied to one input circuit of a phase detector 93 which may be a D-type flip flop. A quadrature reference signal is derived from the last stage of the n+1 stage binary counter 27. This signal is a square-wave signal that is substantially in either leading or lagging quadrature at all times with the output signal of the 60-cycle filter 71. It is manifest that when the output signal of amplifier 57 is of one phase, the signal S from geophone 51 is of greater amplitude than the nulling signal from filter 47. When it is of the opposite phase, the output signal from filter 47 is of greater amplitude than the interfering signal from amplifier 51. Therefore, an indication of whether the amplitude of the nulling signal is too great or too small is provided by whether the residual signal appearing at the output of filter 71 is of a given phase or is 180° removed from that phase. The signal appearing at the $Q^{n+1}$ stage of the n+1 stage binary counter 27 is always in quadrature with the residual signal. If the residual signal leads the reference signal appearing on line 28, the amplitude of the nulling signal is too small. If it lags the quadrature reference signal, the amplitude of the nulling signal is too large. The phase of the output signal of squaring amplifier 91 relative to the quadrature reference signal is detected by the phase detector 93 which produces a logic signal either on lead 97 or 95 depending on whether the signals from amplifier 91 leads or lags the reference signal. When the signal lags the quadrature reference signal, a logic signal is placed on line 95 but not on line 97 so that the count generated by the N-STAGE, UP-DOWN counter 37 will decrease. When the signal from amplifier 91 leads the quadrature reference signal on line 28, a logic signal will appear on line 97 to increase the binary count generated by the N-STAGE, UP-DOWN counter 37.

Figure 2:
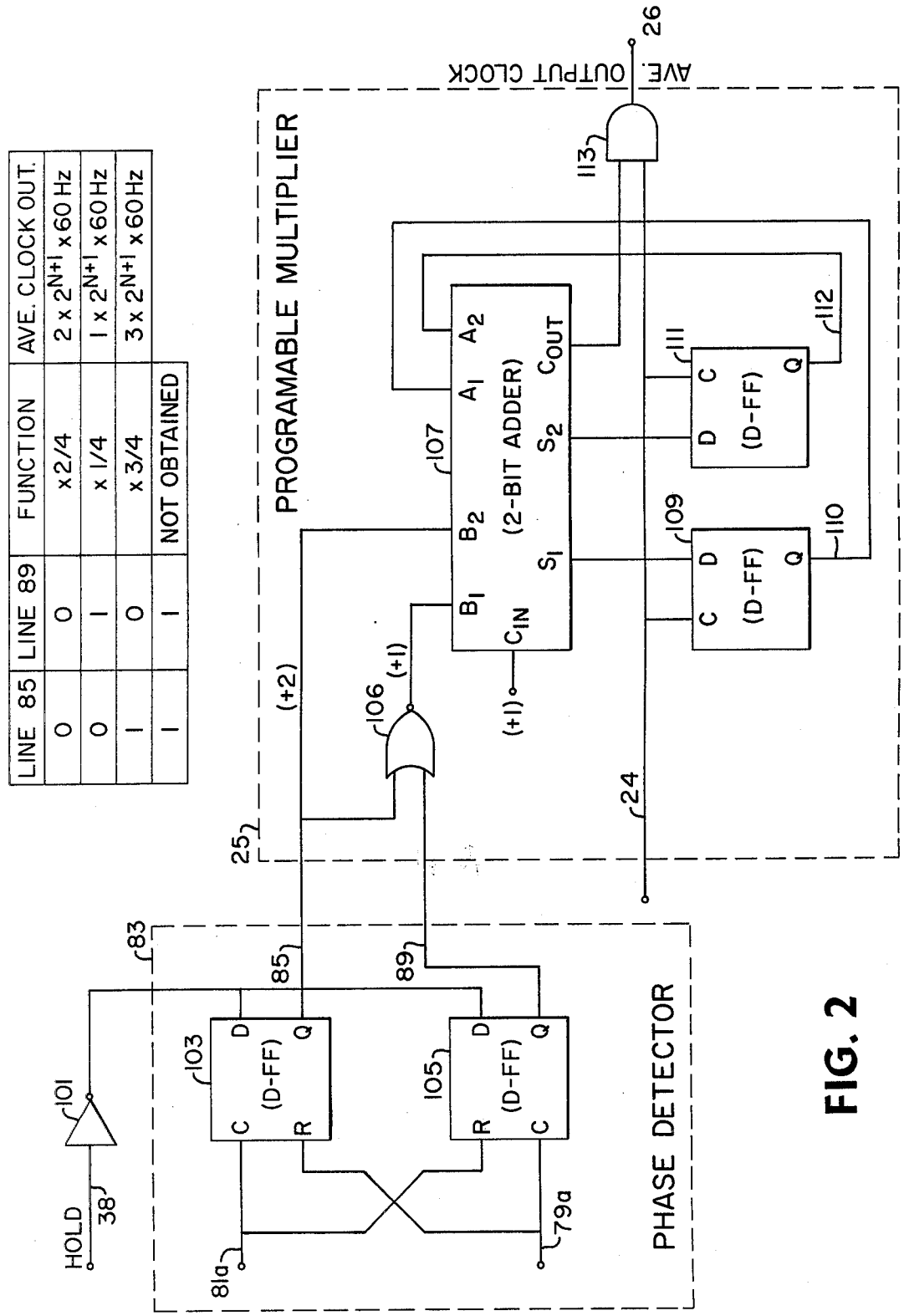
FIG. 2 is a schematic diagram of apparatus suitable for use as the phase detector and programmable multiplier illustrated in FIG. 1.

With reference now to FIG. 2 there is shown circuit details of the phase detector 83 and the programmable multiplier 25 as well as the interconnections therebetween. The phase detector 83 comprises two D-type flip flops 103 and 105 with their "D" terminals interconnected, and their respective "C" and "R" terminals crossconnected. Line 81a is connected to the C terminal of flip flop 103 and to the R terminal of flip flop 105, and line 79a is connected to the C terminal of flip flop 105 and the R terminal of flip flop 103. The "hold" line 38 is connected to the D terminals of both flip flops 103 and 105 through an inverter circuit 101. The programmable multiplier 25 comprises a two-bit adder circuit 107 and two D-type flip flops 109 and 111. The two-bit adder, which may be a RCA CD-4008 integrated circuit, has an input "carry" circuit $C_{In}$ to which is always applied a positive logic signal, a pair of first input digit circuits $B_1$ and $B_2$, a second pair of input digit circuits $A_1$ and $A_2$, a pair of output digit circuits $S_1$ and $S_2$, and a carry output circuit $C_{Out}$. The output digit circuits $S_1$ and $S_2$ are connected to the D inputs of flip flops 109 and 111. Line 24a from circuit 3 is connected to the C inputs of flip flops 109 and 111, and the Q output circuits are connected through lines 110 and 112 to the input digit circuits $A_1$ and $A_2$ of adder 107. The carry output circuit of adder 107 is connected to one input terminal of AND circuit 113. The other input terminal is connected to line 24a. The Q output circuit of flip flop 103 is connected through line 85 to the $B_2$ input digit circuit of adder 107 and, through NOR circuit 106 to the other digit circuit $B_1$ of adder 107. The Q output of flip flop 105 is connected to the $B_1$ input through NOR circuit 106.

Figures 3A, 3B, 3C, 4:
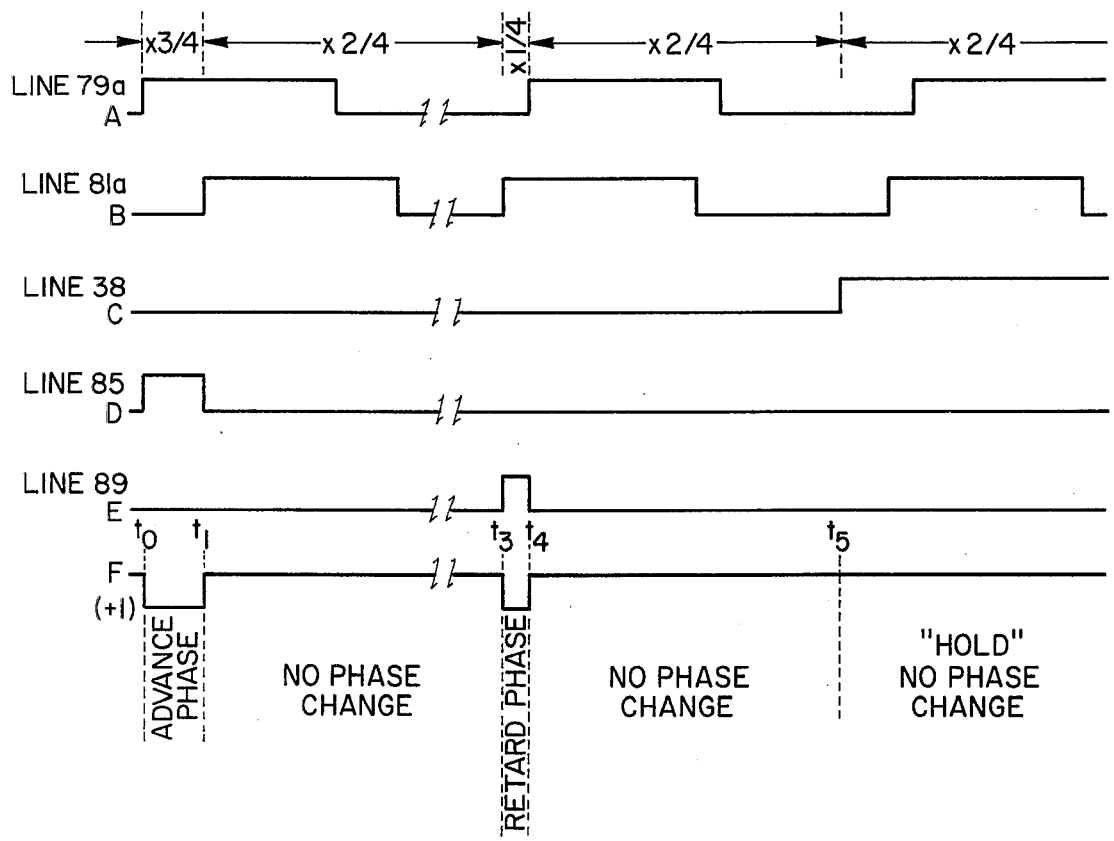
FIGS. 3A, 3B, and 3C are time-step tables illustrating the operation of the programmable multiplier of FIG. 2.
FIG. 4 is a waveform illustration of signals appearing at various locations in the circuit of FIG. 2, drawn to the same time scale.

The operation of phase detector 83 and multiplier 25 will be explained with reference to FIGS. 3A, 3B, 3C and with respect to the wave forms of FIGS. 4A through 4F. Referring now to FIG. 3A in connection with the programmable multiplier of FIG. 2, let it be assumed that initially $S_1$, $S_2$, and $C_{Out}$ are in the states indicated at the top of the column of FIG. 3A, that a 0 logic signal is on line 85, that a 1 logic signal is on line 89 and that clock pulses appear on line 24a. With the first clock pulse, $C_{Out}$, $S_2$ and $S_1$ will be indicative of the binary number 001. On the next clock pulse the number 01 will be transferred to input circuits $A_2$ and $A_1$ and the binary number 010 will appear in the output circuits $C_{Out}$, $S_2$, and $S_1$. On the next clock pulse the binary number 10 will appear at input circuits $A_2$ and $A_1$ and the binary number 011 will appear at $C_{Out}$, $S_2$, and $S_1$. With the next clock pulse the number 100 will appear to $C_{Out}$, $S_2$, and $S_1$. Thereafter the sequence will repeat. If, assuming the same initial conditions, a logic signal indicative of 0 is placed on line 85 and a logic signal indicative of 0 is placed on line 89, the sequence of binary numbers indicated in FIG. 3B will result as the circuit is clocked. Likewise if the logic signal 1 is placed on line 85 and the logic signal 0 is placed on line 89, the sequence of FIG. 3C will result. It is apparent that logic signals 0 and 0 on lines 85 and 89 respectively will result in an output clock signal on line 26 having half the average pulse repetition rate of the clock signal on line 24a. The logic signals of 0 and 1 on lines 85 and 89 will result in a clock signal on line 26 having one-quarter the average pulse repetition rate of the clock signal on line 24a, while the logic numbers 1 and 0 on lines 85 and 89 will result in a clock signal having three-quarters the average pulse repetition rate of the clock signal on line 24a.

A 1 logic signal appearing on line 38 will override any signals appearing on lines 81a and 79a. The 1 logic signal appearing on line 38 will result in 0 logic signals on line 89 and 85 without respect to whether signals appear at lines 81a and 79a.

Referring now to FIG. 4, waveform A represents a signal such as might appear on line 79a and waveform B represents a logic signal such as may appear on line 81a. During the period $t_0$ to $t_1$ waveform A leads waveform B and a logic signal will appear on line 85 during this time interval for a period sufficient to bring the signals on line 49 and 52 closer into phase synchronism. During the period $t_1$ to $t_3$ no logic signals will appear on lines 85 and 89 so that the time phase of the output signal from multiplier 25 is neither advanced nor retarded. During the period $t_3$ to $t_4$ the leading edge of the waveform on line 81a leads the leading edge of the waveform on line 79a and a 1 logic signal appears on line 89. During this period the repetition rate of the signals on line 26 is decreased so that the time phase of the signal appearing on line 49 is retarded. During the time period $t_4$ to $t_5$ again no logic signals appear on lines 85 and 89 so that the time phase of the signal on line 49 is neither advanced nor retarded. At $t_5$ a hold signal appears on line 38 so that even though the leading edge of the logic signal on line 81a leads the logic signal on line 79a, there is no change in the time phase of the output signal on line 49. Thus, it can be seen that the repetition rate of the output signal appearing on line 26 can be increased or decreased and as a result the time phase of the signal appearing on line 49 can be advanced, retarded, or held by appropriate signals appearing on lines 81a, 79a, and 38.

The overall operation of the circuit of FIG. 1 will now be described. The interfering signal detected by antenna 5 produces a pulse train at the output of circuit 3 having a pulse repetition rate of $2^{n-3} \times 60$ Hz and is as defined above. The signal is applied to the programmable multiplier 25 where its repetition rate can be either increased, decreased, or held and is converted to a truncated triangular wave which after passage through a filter 47 is combined with a geophone signal from geophone 51. The result is that the interfering signal as detected by geophone 51 and the leads 52 therefrom is at least partially attenuated or nulled. The residual interfering signal at the output of filter circuit 71 is applied to two circuits. One circuit comprising adding and difference taking circuit 75, 77, squaring amplifier 79 and 81, and phase detector 83, is for the purpose of detecting whether the nulling signal appearing on lead 49 leads or lags the geophone signal appearing at line 52, and for producing logic signals for controlling the programmable multiplier 25 so as to appropriately increase or decrease the repetition rate of the output signals from the programmable multiplier to more closely bring the geophone signal and the nulling signal into phase synchronism. The other circuit, comprising squaring amplifier 91 and phase detector 93, is for the purpose of producing logic signals indicative of whether the residual signal leads or lags a reference quadrature signal so as to produce an output signal indicative of whether the nulling signal is too great in amplitude or too small in amplitude to most effectively eliminate the interfering signal from the geophone output signal. The logic signals are applied to the N-STAGE, UP-DOWN counter to control the amount of truncation of the truncated triangular wave at the output of digital-to-analog converter 39, and thus the amplitude of the filtered signal appearing on line 49. Just before a seismic observation, a logic signal is applied to terminal 36b and hence to line 38 and to the hold line of UP/DOWN counter 37 to prevent any changes in the amplitude or phase of the nulling signal during the seismic observation. Inasmuch as the probablility of a severe change in the amplitude or phase of the nulling signal is very small during the relatively small time interval required for a seismic observation, it is highly improbable that the output signal from amplifier 57 as recorded by recorder 58 will be appreciably affected thereby.

It is important that the speed of phase adjustment be at least 50 times as fast as the speed of amplitude adjustment in the circuit described above. More particularly, the time required to range through 360° of phase adjustment is 1/50th the amount of time to range through the full range of amplitude adjustments (i.e., from zero to full scale amplitude). The reason for this is that the amplitude and phase adjustments are coupled; the output of nulling amplifier 57 depends not only on phase but also on amplitude. A change in the amplitude difference between the signals on line 52 and 49 can produce not only an amplitude change on the output of nulling amplifier 57 but also a phase change. Therefore, one adjustment must operate at a much faster rate than the other so that there is effectively no coupling, hunting or oscillation produced in the circuit. The rate at which the amplitude is allowed to change is determined by the clock signal appearing on line 28. The rate is 60 amplitudes steps per second in the circuit described above. The rate at which the phase changes is determined by the pulse widths of the signals on lines 85 and 89. These pulse widths are chosen so that a change of 360° in phase of the signal appearing on line 49 may be accomplished in 1/60th of one second. The phase will acquire a null within one or two cycles of the 60 cycle form.

We claim:

1. Apparatus for detecting the phase difference between a first substantially monochromatic sinusoidal electrical signal and a second substantially monochromatic sinusoidal signal having substantially the same frequency as said first substantially monochromatic signal that is a component of a composite electrical signal which may contain other signals, which comprises:

means for producing a residual signal equal to the difference between said composite signal and said first substantially monochromatic signal;

means for producing a first sum signal equal to the sum of said composite signal and said first substantially monochromatic signal;

first filtering means for filtering from said residual signal all frequency components not of substantially the frequency of said first substantially monochromatic signal;

second filtering means having a transfer function substantially equal to the transfer function of said first filtering means for filtering said first sum signal;

means for producing a second sum signal indicative of the sum of the filtered first sum signal and the filtered residual signal;

means for producing a difference signal indicative of the difference between the filtered first sum signal and the filtered residual signal; and means for detecting the phase difference between the output signals of said means for producing a second sum signal and said means for producing a difference signal.

* * * * *